United States Patent
Lee et al.

(10) Patent No.: US 10,163,983 B1
(45) Date of Patent: Dec. 25, 2018

(54) COMPLEMENTARY RESISTANCE SWITCHABLE FILLER AND NONVOLATILE COMPLEMENTARY RESISTANCE SWITCHABLE MEMORY COMPRISING THE SAME

(71) Applicant: KOREA INSTITUTE OF SCIENCE AND TECHNOLOGY, Seoul (KR)

(72) Inventors: Sang-Soo Lee, Seoul (KR); Jong Hyuk Park, Seoul (KR); Jeong Gon Son, Seoul (KR); Young Jin Kim, Seoul (KR); Minsung Kim, Seoul (KR); Heesuk Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/817,666

(22) Filed: Nov. 20, 2017

(30) Foreign Application Priority Data

Jul. 25, 2017 (KR) ......................... 10-2017-0093948

(51) Int. Cl.
*H01L 27/24* (2006.01)
*G11C 13/00* (2006.01)
(Continued)

(52) U.S. Cl.
CPC ...... *H01L 27/2481* (2013.01); *G11C 13/0011* (2013.01); *G11C 13/0069* (2013.01);
(Continued)

(58) Field of Classification Search
CPC ............... H01L 27/2481; H01L 45/145; H01L 45/1233; H01L 45/1608; H01L 45/1253;
(Continued)

(56) References Cited

U.S. PATENT DOCUMENTS 8,749,009 B2 * 6/2014 Young ................. H01L 31/0481
257/439
9,865,621 B2 * 1/2018 Nakatani ............. H01L 27/1225
(Continued)

FOREIGN PATENT DOCUMENTS

KR 10-2012-0107304 A 10/2012
KR 10-1416243 B1 7/2014
(Continued)

*Primary Examiner* — Harry W Byrne
*Assistant Examiner* — Sultana Begum
(74) *Attorney, Agent, or Firm* — Rabin & Berdo, P.C.

(57) ABSTRACT

A resistance-switchable material containing: an insulating support; and a complementary resistance switchable filler dispersed in the insulating support, wherein the complementary resistance switchable filler has a core-shell structure containing: a wire-type conductive core containing a conductive material; and an insulating shell formed on the surface of the core and containing an insulating material. Because a first resistive layer, a conductive layer and a second resistive layer are formed as one layer and bipolar conductive filaments are formed on the substantially different resistive layers, the memory can exhibit complementary resistive switching characteristics. In addition, the complementary resistance switchable memory of the present disclosure can be prepared through a simplified process at low cost by introducing a simple process of coating a paste in which a complementary resistance switchable filler and a supporting material are mixed.

12 Claims, 6 Drawing Sheets

(51) Int. Cl.
*H01L 45/00* (2006.01)
*H01B 1/24* (2006.01)

(52) U.S. Cl.
CPC ........... *H01B 1/24* (2013.01); *H01L 45/1233* (2013.01); *H01L 45/1253* (2013.01); *H01L 45/145* (2013.01); *H01L 45/1608* (2013.01); *G11C 2213/71* (2013.01)

(58) Field of Classification Search
CPC ............ G11C 13/0011; G11C 13/0069; G11C 13/0004; G11C 13/0007; G11C 2213/71; G11C 2213/79; G11C 2213/72
See application file for complete search history.

(56) References Cited

U.S. PATENT DOCUMENTS

| | | | |
|---|---|---|---|
| 2012/0241706 A1* | 9/2012 | Lee | H01B 1/22 257/2 |
| 2017/0117465 A1* | 4/2017 | Chang | H01L 45/08 |
| 2017/0330916 A1* | 11/2017 | Hong | H01L 27/2481 |
| 2018/0033518 A1* | 2/2018 | Ota | H01B 3/447 |
| 2018/0122825 A1* | 5/2018 | Lupino | G11C 13/0021 |

FOREIGN PATENT DOCUMENTS

| | | |
|---|---|---|
| KR | 10-1460100 B1 | 11/2014 |
| KR | 10-2016-0049574 A | 5/2016 |

\* cited by examiner

COMPLEMENTARY RESISTANCE SWITCHABLE FILLER AND NONVOLATILE COMPLEMENTARY RESISTANCE SWITCHABLE MEMORY COMPRISING THE SAME

CROSS-REFERENCE TO RELATED APPLICATIONS

This application claims, under 35 U.S.C. § 119, the priority of Korean Patent Application No. 10-2017-0093948 filed on Jul. 25, 2017 in the Korean Intellectual Property Office, the disclosure of which is incorporated herein by reference in its entirety.

TECHNICAL FIELD

The present disclosure relates to a complementary resistance switchable filler and a nonvolatile complementary resistance switchable memory containing the same, more particularly to a complementary resistance switchable filler which allows for preparation of a complementary resistance switchable memory with transparency and flexibility without introducing a multi-layer structure by interposing an insulating layer paste in which the complementary resistance switchable filler of a core-shell structure is dispersed between electrodes and a nonvolatile complementary resistance switchable memory containing the same.

BACKGROUND

The semiconductor-related industry currently typified by DRAM and flash memory has developed successfully through miniaturization and integration based on the fact that the principles of operation can be maintained even when the size of the devices is decreased. However, with the recent rapid development of the information and communications technology, the performance and complexity of the devices are increasing and high speed, high integration and power saving are required for the memory devices. But, the DRAM is problematic in that it is volatile and is limited in data processing speed. And, the flash memory has the problem that it requires a high threshold voltage (>5 V) in addition to the problems of increased complexity after the sub-30 nm process, electrical degradation and slow operation speed. Accordingly, development of next-generation memory devices overcoming the problems of the existing memory devices is necessary.

As next-generation nonvolatile memory devices for solving these problems, phase-change RAM, magnetic RAM (MRAM), resistance switchable RAM (RRAM), etc. are available. Among these next-generation memory devices, the RRAM records the data 1 and 0 as low resistance state (LRS) and high resistance state (HRS) are switched reversibly depending on the applied voltage conditions. In addition, the RRAM is the most promising candidate for commercialization because it can satisfy the data nonvolatility of flash memory, the fast operation speed of SRAM and, above all, the low power consumption of DRAM. In particular, it is drawing a lot of attentions because high integration density can be achieved through a simple 3-dimensional vertical crossbar array structure including a resistance switching layer made of an oxide thin film between top and bottom electrodes.

However, parasitic current resulting from interference between adjacent non-target cells of low resistance state located on the same bit line or word line in the crossbar array is known as the biggest problem in reliable operation of the RRAM. Sneak current passing through the cells located on the same row or column as the target cell may result in errors when reading and recording cell state. For example, sneak current through adjacent non-target cells may cause errors in reading by affecting the total current of the target cell.

The one-transistor one-resistor (1T1R) structure proposed to solve the problem caused by the parasitic current has superior selectivity but the memory integration density is significantly limited. The 1S1R structure using one selector and one resistor, which was proposed as another solution, makes the structure of the crossbar array complicated. In addition, the nonlinear element of the selector is significantly dependent on the array size and enough current may not pass to the target cell.

Accordingly, a complementary resistance switchable (CRS) random access memory which exhibits memory function and selectivity at the same was proposed recently. The CRS memory has an insulator/conductor/insulator structure between top and bottom electrodes as if two resistance switchable memories face each other. The CRS memory records "0" when the top element is in high resistance state and the bottom element is in low resistance state. On the contrary, it records "1" when the top element is in low resistance state and the bottom element is in high resistance state. Because the entire device is in high resistance state whether "0" or "1" is recorded, sneak current resulting from the interference of adjacent non-target cells is excluded. In addition, because it exhibits self-compliance current behavior not requiring an external resistor for current compliance, it is not affected by RC delay.

However, because the CRS memory is driven based on the filamentary phenomena of formation and extinction of conductive filaments, it shows the problems occurring in the existing resistance switchable memory based on the filamentary phenomena, such as indefinite and random formation of many filaments. As a result, the CRS memory driven by the complementary behavior of two filaments may suffer from severe device instability (poor endurance/retention). In addition, the CRS memory is problematic in that it is difficult to ensure mechanical stability for a highly integrated crossbar array structure because a process of depositing multiple thin films is necessary for the resistance switchable memory and it is difficult to ensure physical properties required for wearable devices, such as transparency or bendability, due to the presence of multiple intermediate layers.

SUMMARY

The present disclosure has been designed to solve the problems of the existing art and is directed to providing a complementary resistance switchable memory which does not have the layered structure of a top electrode, a first resistive layer, a conductive layer, a second resistive layer and a bottom electrode of the typical complementary resistance switchable memory. Because a first resistive layer, a conductive layer and a second resistive layer are formed as one layer and bipolar conductive filaments are formed on the substantially different resistive layers, the memory can exhibit complementary resistive switching characteristics and read margin can be increased sufficiently by maintaining the on state sufficiently after the set operation and then conducting the reset operation. In addition, transparency and flexibility can be improved by reducing the number of layers.

The present disclosure is also directed to providing a simplified and inexpensive process of preparing a complementary resistance switchable memory by coating a paste in which a complementary resistance switchable filler and a supporting material are mixed.

In an aspect, the present disclosure provides a resistance-switchable material containing: an insulating support; and a complementary resistance switchable filler dispersed in the insulating support, wherein the complementary resistance switchable filler has a core-shell structure containing: a wire-type conductive core containing a conductive material; and an insulating shell formed on the surface of the core and containing an insulating material.

The wire-type conductive core may contain one or more selected from a carbon nanofiber, a carbon nanotube, a gold nanowire, a platinum nanowire, a silver nanowire and a copper nanowire.

The insulating shell may contain one or more selected from $NiO$, $SiO_2$, $TiO_2$, $ZnO$, $HfO_2$, $Nb_2O_5$, $MgO$, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$ and $Ag_3SI$.

The insulating support may contain one or more selected from an acrylic resin, a urethane-based resin, an epoxy-based resin, a polyester-based resin, a phenol-based resin, polyvinyl chloride, polyacetal and polyvinyl alcohol.

In another aspect, the present disclosure provides a nonvolatile complementary resistance switchable memory containing: a substrate; a bottom electrode disposed on the substrate; a resistance-switchable material disposed on the bottom electrode; and a top electrode disposed on the resistance-switchable material, wherein the resistance-switchable material contains: an insulating support; and a complementary resistance switchable filler dispersed in the insulating support, the complementary resistance switchable filler has a core-shell structure containing: a wire-type conductive core containing a conductive material; and an insulating shell formed on the surface of the core and containing an insulating material, and the bottom electrode and the top electrode respectively form two different resistive layers by containing different parts of the insulating shell.

The substrate may be one selected from glass, a silicon wafer and a metal foil.

The bottom electrode or the top electrode may be made of one selected from a metal, a conductive carbon material and a conductive polymer material.

The metal may be one or more selected from Ag, Au, Cu, Ni, Cr, Pt, Pb, Ru, Pd, TiN, W, Co, Mn, Ti and Fe.

The conductive carbon material may be one or more selected from graphene, a carbon nanotube and a fullerene.

The conductive polymer material may be one or more selected from polypyrrole, polythiophene, poly(p-phenylene vinylene), polyaniline, polyacetylene, and PEDOT:PSS (poly(3,4-ethylenedioxythiophene) polystyrene sulfonate).

In another aspect, the present disclosure provides a method for preparing a complementary resistance switchable filler, including: (1) a step of preparing a core dispersion by dispersing a wire-type conductive core in a solvent; and (2) a step of coating an insulating layer on the surface of the wire-type conductive core by adding a precursor of an insulating polymer to the core dispersion.

In another aspect, the present disclosure provides a method for preparing a nonvolatile complementary resistance switchable memory, including: (a) a step of preparing a paste containing the resistance-switchable material described above; (b) a step of forming a bottom electrode on a substrate; (c) a step of forming a resistance-switchable material layer by coating the paste on the bottom electrode and then curing the same; and (d) a step of forming a top electrode on the resistance-switchable material layer.

Specifically, the step (a) may include: (a-1) a step of preparing a complementary resistance switchable filler of a core-shell structure by coating an insulating material on the surface of a conductive material; and (a-2) a step of preparing the paste by mixing the complementary resistance switchable filler with an insulating supporting material.

In the step (a-1), the insulating material may be coated by dispersing the conductive material in a solvent and then adding a precursor of the insulating material.

The conductive material may be one or more selected from a carbon nanofiber, a carbon nanotube, a gold nanowire, a platinum nanowire, a silver nanowire and a copper nanowire.

The insulating material may be one or more selected from $NiO$, $SiO_2$, $TiO_2$, $ZnO$, $HfO_2$, $Nb_2O_5$, $MgO$, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$ and $Ag_3SI$.

The insulating supporting material may be one or more selected from an acrylic resin, a urethane-based resin, an epoxy-based resin, a polyester-based resin, a phenol-based resin, polyvinyl chloride, polyacetal and polyvinyl alcohol.

In the step (b) or (d), the bottom electrode or the top electrode may be formed by a method selected from sputtering, chemical vapor deposition, atomic layer deposition, pulsed laser deposition, molecular beam epitaxy, vacuum thermal deposition and vacuum electron beam deposition.

In the step (c), the paste may be coated by a method selected from spin coating, blade casting and inkjet printing.

The present disclosure provides a complementary resistance switchable memory which does not have the layered structure of a top electrode, a first resistive layer, a conductive layer, a second resistive layer and a bottom electrode of the typical complementary resistance switchable memory. Because a first resistive layer, a conductive layer and a second resistive layer are formed as one layer and bipolar conductive filaments are formed on the substantially different resistive layers, the memory can exhibit complementary resistive switching characteristics and read margin can be increased sufficiently by maintaining the on state sufficiently after the set operation and then conducting the reset operation. In addition, transparency and flexibility can be improved by reducing the number of layers.

In addition, the complementary resistance switchable memory of the present disclosure can be prepared through a simplified process at low cost by introducing a simple process of coating a paste in which a complementary resistance switchable filler and a supporting material are mixed.

DETAILED DESCRIPTION OF EMBODIMENTS

Figure 1:
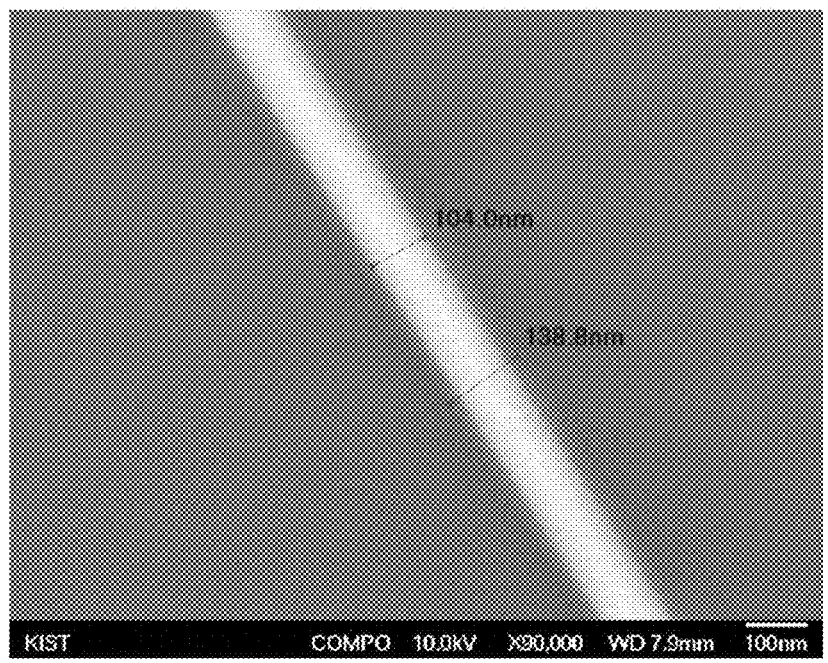
FIG. 1 shows a field emission scanning electron microscopic (FE-SEM) image of a complementary resistance switchable filler prepared in Example 1.

Hereinafter, various aspects and exemplary embodiments of the present disclosure are described in more detail.

Hereinafter, the exemplary embodiments of the present disclosure are described in more detail referring to the attached drawings so that those of ordinary skill in the art to which the present disclosure belongs can easily carry out the present disclosure.

However, the following description is not intended to limit the present disclosure to specific exemplary embodiments and description of well-known techniques is omitted to avoid unnecessarily obscuring the present disclosure.

The terms used in the present disclosure are intended to describe specific exemplary embodiments, not to limit the present disclosure. Singular expressions include plural expressions unless they have definitely opposite meanings in the context. In the present disclosure, the terms "contain", "include", "have", etc. indicate that a feature, a number, a step, an operation, an element or a combination thereof described in the specification is present, but does not preclude the possibility of presence or addition of one or more other features, numbers, steps, operations, elements or combinations thereof.

Hereinafter, a resistance-switchable material of the present disclosure is described in detail.

The resistance-switchable material of the present disclosure may contain: an insulating support; and a complementary resistance switchable filler dispersed in the insulating support.

The complementary resistance switchable filler may have a core-shell structure containing: a wire-type conductive core containing a conductive material; and an insulating shell formed on the surface of the core and containing an insulating material.

The conductive core may contain a carbon nanofiber, a carbon nanotube, a gold nanowire, a platinum nanowire, a silver nanowire, a copper nanowire, etc.

The insulating shell may contain NiO, $SiO_2$, $TiO_2$, ZnO, $HfO_2$, $Nb_2O_5$, MgO, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$, $Ag_3SI$, etc.

The insulating support may contain an acrylic resin, a urethane-based resin, an epoxy-based resin, a polyester-based resin, a phenol-based resin, polyvinyl chloride, polyacetal, polyvinyl alcohol, etc.

Hereinafter, a nonvolatile complementary resistance switchable memory of the present disclosure is described in detail.

The nonvolatile complementary resistance switchable memory of the present disclosure may have a structure in which a substrate, a bottom electrode, a resistance-switchable material and a top electrode are stacked sequentially.

The resistance-switchable material may contain: an insulating support; and a complementary resistance switchable filler dispersed in the insulating support, and the complementary resistance switchable filler may have a core-shell structure containing: a wire-type conductive core containing a conductive material; and an insulating shell formed on the surface of the core and containing an insulating material.

The substrate may be glass, a silicon wafer, a metal foil, etc.

The conductive material contained in the wire-type conductive core may be a carbon nanofiber, a carbon nanotube, a gold nanowire, a platinum nanowire, a silver nanowire, a copper nanowire, etc.

The wire-type conductive core may have a diameter of specifically 10-200 nm, more specifically 15-100 nm, even more specifically 20-60 nm.

In addition, the wire-type conductive core may have an aspect ratio of specifically 1:10-1:500, more specifically 1:30-1:250, even more specifically 1:50-1:100.

The insulating material contained in the insulating shell may include NiO, $SiO_2$, $TiO_2$, ZnO, $HfO_2$, $Nb_2O_5$, MgO, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$, $Ag_3SI$, etc.

The insulating shell may be coated on the wire-type conductive core with a thickness of specifically 10-30 nm, more specifically 15-25 nm.

The top electrode is disposed on the resistance-switchable material.

The bottom electrode and the top electrode may respectively form two different resistive layers by contacting different parts of the insulating shell.

The bottom electrode or the top electrode may be made of a metal, a conductive carbon material or a conductive polymer material.

The conductive carbon material may be graphene, a carbon nanotube, a fullerene, etc.

The conductive polymer material may be polypyrrole, polythiophene, poly(p-phenylene vinylene), polyaniline, polyacetylene, PEDOT:PSS (poly(3,4-ethylenedioxythiophene) polystyrene sulfonate), etc.

Hereinafter, a method for preparing a complementary resistance switchable filler of the present disclosure is described.

First, a core dispersion is prepared by dispersing a wire-type conductive core in a solvent (step 1).

Reference can be made to the foregoing description for details about the wire-type conductive core.

Specifically, the solvent may be an alcohol solvent.

Next, an insulating layer is coated on the surface of the wire-type conductive core by adding a precursor of an insulating polymer to the core dispersion (step 2).

The precursor of the insulating material may be tetraethoxysilane (TEOS), tetramethyl orthosilicate (TMOS), titanium tetrachloride ($TiCl_4$), titanium(IV) propoxide (Ti(OH)$_4$), aluminum sulfate ($Al_2(SO_4)_3$), zinc nitrate (Zn(NO$_3$)$_2$), zirconium nitrate (Zr(NO$_3$)$_4$), silver nitrate (AgNO$_3$), etc.

As a result of the reaction, an insulating material such as NiO, $SiO_2$, $TiO_2$, ZnO, $HfO_2$, $Nb_2O_5$, MgO, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$, $Ag_3SI$, etc. may be coated on the surface of the wire-type conductive core.

Hereinafter, a method for preparing a complementary resistance switchable memory of the present disclosure is described.

First, a paste containing the resistance-switchable material of the present disclosure is prepared (step a).

A complementary resistance switchable filler of a core-shell structure is prepared by coating an insulating material on the surface of a conductive material (step a-1).

The insulating material may be coated by dispersing the conductive material in a solvent and then adding the precursor of the insulating material.

The conductive material may be a wire-type conductive material such as a carbon nanofiber, a carbon nanotube, a gold nanowire, a platinum nanowire, a silver nanowire, a copper nanowire, etc.

Reference can be made to the foregoing description about the method for preparing a complementary resistance switchable filler for details about the precursor of the insulating material.

As a result of the reaction, the insulating material may be coated on the surface of the wire-type conductive core. Reference can be made to the foregoing description about the method for preparing a complementary resistance switchable filler for details about the insulating material.

Next, a paste is prepared by mixing the complementary resistance switchable filler with an insulating supporting material (step a-2).

The insulating supporting material may be an acrylic resin, a urethane-based resin, an epoxy-based resin, a polyester-based resin, a phenol-based resin, polyvinyl chloride, polyacetal, polyvinyl alcohol, etc.

Then, a bottom electrode is formed on a substrate (step b).

The bottom electrode may be formed by sputtering, chemical vapor deposition, atomic layer deposition, pulsed laser deposition, molecular beam epitaxy, vacuum thermal deposition, vacuum electron beam deposition, etc.

The bottom electrode may be made of a metal, a conductive carbon material, a conductive polymer material, etc. and reference can be made to the foregoing description for details.

Next, a resistance-switchable material layer is formed by coating the paste on the bottom electrode and then curing the same (step c).

The paste may be coated by spin coating, blade casting, inkjet printing, etc., although the scope of the present disclosure is not limited thereto.

The curing may be performed by thermal curing or photocuring. Specifically, it may be performed by thermal curing.

Finally, a top electrode is formed on the resistance-switchable material layer (step d).

The top electrode may be formed by sputtering, chemical vapor deposition, atomic layer deposition, pulsed laser deposition, molecular beam epitaxy, vacuum thermal deposition, vacuum electron beam deposition, etc.

The top electrode may be made of a metal, a conductive carbon material, a conductive polymer material, etc. and reference can be made to the foregoing description for details.

Hereinafter, the present disclosure is described in more detail through examples.

EXAMPLES

Example 1

(1) Preparation of Paste

A complementary resistance-switchable filler was prepared by coating $SiO_2$ on the surface of a Ag nanowire (AgNW) with a diameter of about 104 nm and an aspect ratio of 1:80. First, after dispersing 2 mL of a AgNW dispersion (20 mg/mL, ACS Materials) in 40 mL of an ethanol solvent, a $SiO_2$ insulating shell was formed on the surface of the AgNW by adding 0.2 g of TEOS (tetraethyl orthosilicate, Sigma Aldrich) and 2 mL of ammonium hydroxide (28%, Junsei) and performing reaction at 50° C. for 30 minutes. The coating thickness of $SiO_2$ was set to about 17 nm by controlling the reaction temperature and the amount of TEOS. Then, a paste was prepared by mixing 10 mg of the prepared complementary resistance-switchable filler $SiO_2$@AgNW with 1 g of PVA ($M_w$: 85000-124000, Sigma Aldrich) and 9 g of water.

(2) Preparation of Nonvolatile Complementary Resistance Switchable Memory

A resistance-switchable material layer was formed by spin-coating the paste on a $Pt/TiO_2/SiO_2/Si$ bottom substrate having a bottom electrode formed and then curing the same at 70° C. for 24 hours. A patterned Ag top electrode was formed on the resistance-switchable material layer by thermal deposition using a mask.

Comparative Example 1 (*ACS Appl. Mater. Interfaces* 2013, 5, 1793-1799)

Figure 6:
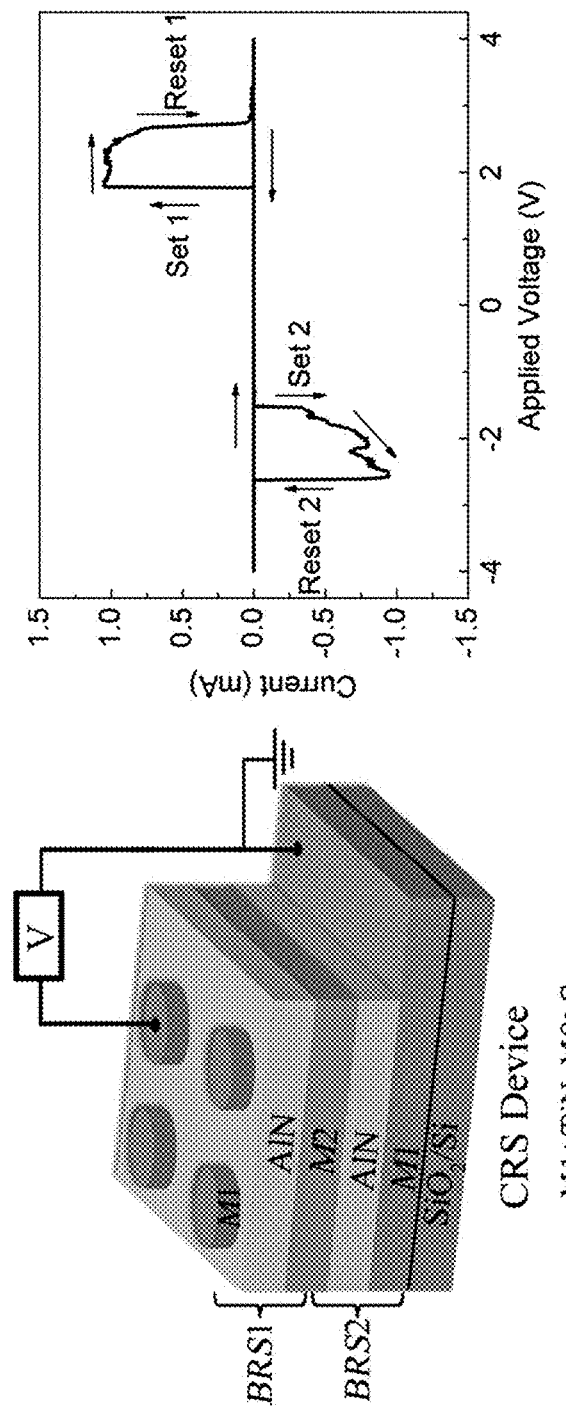
FIG. 6 schematically shows a complementary resistance switchable memory prepared in Comparative Example 1.

First, a 120 nm-thick TiN electrode was formed on a $SiO_2/Si$ substrate by sputtering and then a 50 nm-thick AlN layer (first insulating layer) was formed on a Pt electrode by sputtering. Next, a 40 nm-thick Cu layer (conductive layer) was formed on a first oxide semiconductor layer and then a 50 nm-thick AlN layer (second insulating layer) was formed on the Cu layer by sputtering. Then, a nonvolatile complementary resistance switchable memory of a vertically layered structure was prepared by forming a 120 nm-thick T electrode on the second oxide semiconductor layer by sputtering. The memory of Comparative Example 1 is schematically illustrated in FIG. 6.

TEST EXAMPLES

Test Example 1: Observation of Complementary Resistance Switchable Filler (FE-SEM)

FIG. 1 shows a field emission scanning electron microscopic image of the complementary resistance switchable filler $SiO_2$@AgNW prepared in Example 1.

From FIG. 1, it can be seen that the complementary resistance switchable filler of a core-shell structure was prepared as $SiO_2$ was coated with a uniform thickness on the whole surface of the silver nanowire.

Test Example 2: Physical Properties of Complementary Resistance Switchable Memory FIG. 2 is an image showing the shape and flexibility of the complementary resistance switchable memory prepared in Example 1 and FIG. 3 shows images showing the transparency of the complementary resistance switchable memory layer prepared in Example 1.

Figure 2:
FIG. 2 is an image showing the shape and flexibility of a complementary resistance switchable memory prepared in Example 1.
Figure 3:
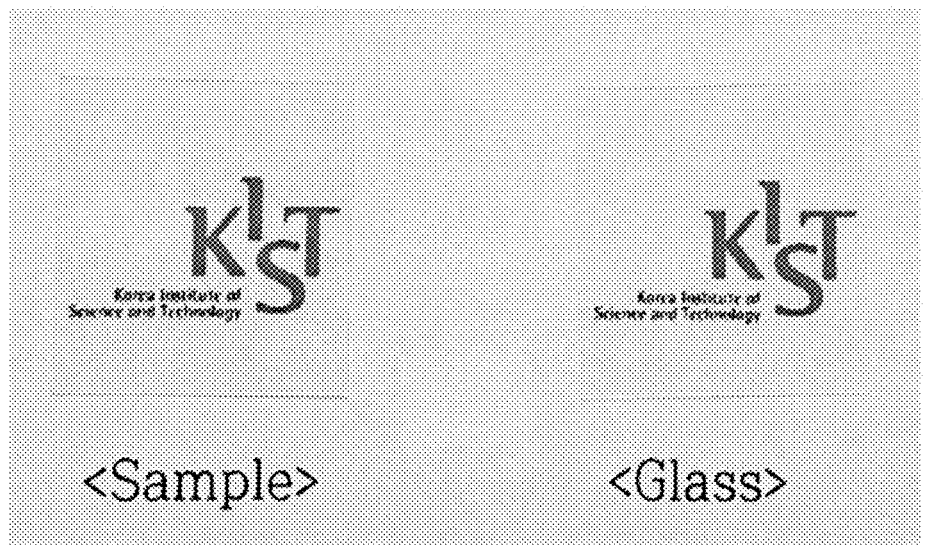
FIG. 3 shows images of a complementary resistance switchable memory layer prepared in Example 1.

From FIG. 2 and FIG. 3, it can be seen that the memory device of Example 1 is bendable and transparent.

Test Example 3: Current-Voltage Curve of Resistance Switching

Figure 4:
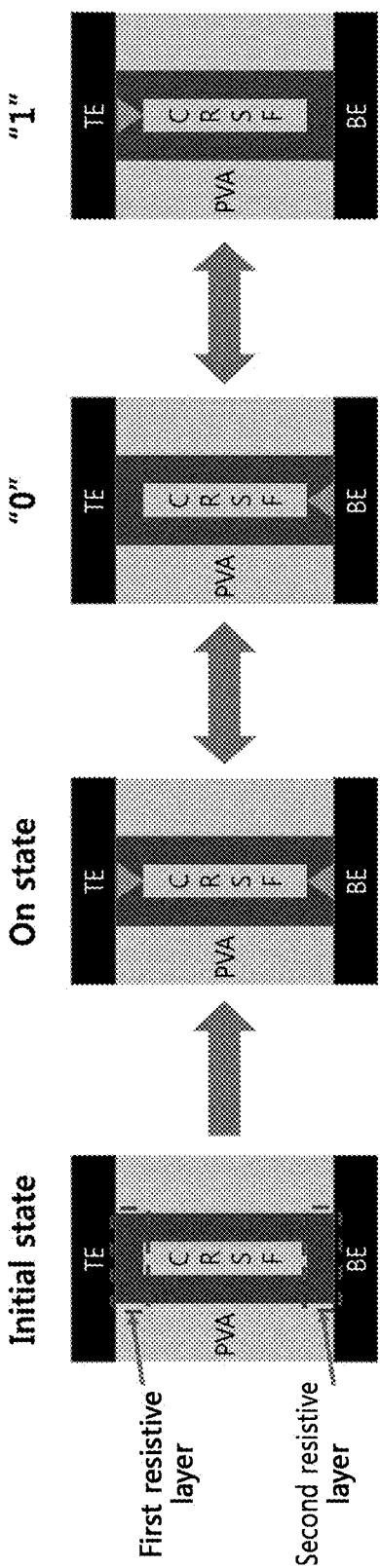
FIG. 4 schematically shows a complementary resistance switchable memory of the present disclosure and a driving mechanism thereof.
Figure 5:
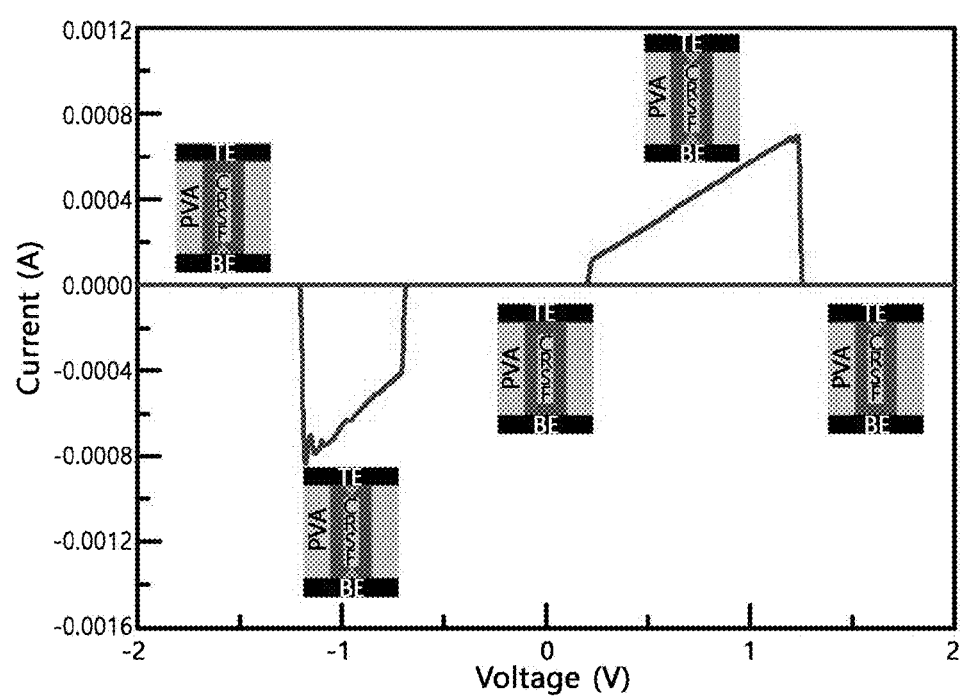
FIG. 5 shows the change in the resistance of a complementary resistance switchable memory prepared according to an exemplary embodiment of the present disclosure.

FIG. 4 schematically shows the complementary resistance switchable memory of the present disclosure and a driving mechanism thereof and FIG. 5 shows the change in the resistance of the complementary resistance switchable memory prepared according to an exemplary embodiment of the present disclosure.

From FIG. 4 and FIG. 5, it can be seen that the complementary resistance switchable filler prepared in Example 1 has a first resistive layer/conductor/second resistive layer structure as if two resistance switchable memories face each other because the complementary resistance switchable filler (CRSF) is included between the top electrode (TE) and the bottom electrode (BE). Accordingly, the memory records "0" when the top element is in high resistance state and the bottom element is in low resistance state. On the contrary, it records "1" when the top element is in low resistance state and the bottom element is in high resistance state. Because the entire device is in high resistance state whether "0" or "1" is recorded, sneak current resulting from the interference of adjacent non-target cells can be excluded.

Test Example 4

As a result of comparing the current-voltage curves of resistance switching of the complementary resistance switchable memories prepared in Example 1 (FIG. 4) and Comparative Example 1 (FIG. 6), almost similar electrical properties were observed. Accordingly, it was confirmed that the memory of Example 1, wherein a first resistive layer, a conductive layer and a second resistive layer are formed as a single layer through coating of the paste, can exhibit complementary resistive switching characteristics because bipolar conductive filaments are formed in substantially different resistive layers.

While the present disclosure has been described with respect to the specific embodiments, it will be apparent to those skilled in the art that various changes and modifications may be made without departing from the spirit and scope of the disclosure as defined in the following claims.

What is claimed is:

1. A nonvolatile complementary resistance-switchable material comprising:
   a substrate;
   a bottom electrode disposed on the substrate;
   a resistance-switchable material disposed on the bottom electrode; and
   a top electrode disposed on the resistance-switchable material,
   wherein the resistance-switchable material comprises:
      an insulating support; and
      a complementary resistance switchable filler dispersed in the insulating support,
   wherein the complementary resistance switchable filler has a core-shell structure comprising:
      a wire-type conductive core comprising a conductive material; and
      an insulating shell formed on the surface of the core and comprising an insulating material;
   wherein the bottom electrode and the top electrode respectively form two different resistive layers by contacting different parts of the insulating shell,
   wherein a first resistive layer, a conductive layer, and a second resistive layer are formed between the bottom electrode and the top electrode so that two resistance switchable memories are disposed to face each other.

2. The nonvolatile complementary resistance-switchable material according to claim 1, wherein the wire-type conductive core comprises one or more selected from a carbon nanofiber, a carbon nanotube, a gold nanowire, a platinum nanowire, a silver nanowire and a copper nanowire.

3. The nonvolatile complementary resistance-switchable material according to claim 1, wherein the insulating shell comprises one or more selected from $NiO$, $SiO_2$, $TiO_2$, $ZnO$, $HfO_2$, $Nb_2O_5$, $MgO$, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, $CuS$, $AgI$, $Ag_2Te$, $Ag_2HgI_4$ and $Ag_3SI$.

4. The nonvolatile complementary resistance-switchable material according to claim 1, wherein the insulating support comprises one or more selected from an acrylic resin, a urethane-based resin, an epoxy-based resin, a polyester-based resin, a phenol-based resin, polyvinyl chloride, polyacetal and polyvinyl alcohol.

5. The nonvolatile complementary resistance switchable memory according to claim 1, wherein the bottom electrode or the top electrode is made of one selected from a metal, a conductive carbon material and a conductive polymer material.

6. The nonvolatile complementary resistance switchable memory according to claim 5, wherein the metal is one or more selected from Ag, Au, Cu, Ni, Cr, Pt, Pb, Ru, Pd, TiN, W, Co, Mn, Ti and Fe.

7. The nonvolatile complementary resistance switchable memory according to claim 5, wherein the conductive carbon material is one or more selected from graphene, a carbon nanotube and a fullerene.

8. The nonvolatile complementary resistance switchable memory according to claim 5, wherein the conductive polymer material is one or more selected from polypyrrole, polythiophene, poly(p-phenylene vinylene), polyaniline, polyacetylene, and PEDOT:PSS (poly(3,4-ethylenedioxythiophene) polystyrene sulfonate).

9. A method for preparing a nonvolatile complementary resistance switchable memory, comprising:
   (a) preparing a paste comprising a resistance-switchable material;
   (b) forming a bottom electrode on a substrate;
   (c) forming a resistance-switchable material layer by coating the paste on the bottom electrode and then curing the same; and
   (d) forming a top electrode on the resistance-switchable material layer,
   wherein the resistance-switchable material comprises:
      an insulating support; and
      a complementary resistance switchable filler dispersed in the insulating support, wherein a method of preparing the complementary resistance switchable filler comprises:
         (1) preparing a core dispersion by dispersing a wire-type conductive core in a solvent; and
         (2) coating an insulating layer on the surface of the wire-type conductive core by adding a precursor of an insulating polymer to the core dispersion.

10. The method for preparing a nonvolatile complementary resistance switchable memory according to claim 9, wherein (a) comprises:
   (a-2) preparing the paste by mixing the complementary resistance switchable filler with the insulating supporting material.

11. The method for preparing a nonvolatile complementary resistance switchable memory according to claim 9, wherein, in (b) or (d), the bottom electrode or the top electrode is formed by a method selected from sputtering, chemical vapor deposition, atomic layer deposition, pulsed laser deposition, molecular beam epitaxy, vacuum thermal deposition and vacuum electron beam deposition.

12. The method for preparing a nonvolatile complementary resistance switchable memory according to claim 9, wherein, in (c), the paste is coated by a method selected from spin coating, blade casting and inkjet printing.

* * * * *